US006907955B2

(12) United States Patent
Masuda

(10) Patent No.: US 6,907,955 B2
(45) Date of Patent: Jun. 21, 2005

(54) ELECTROMAGNETIC ELECTROACOUSTIC TRANSDUCER

(75) Inventor: Mitsuhiro Masuda, Shizuoka (JP)

(73) Assignee: Star Micronics Co., Ltd., Shizuoka (JP)

( * ) Notice: Subject to any disclaimer, the term of this patent is extended or adjusted under 35 U.S.C. 154(b) by 0 days.

(21) Appl. No.: 10/694,219

(22) Filed: Oct. 28, 2003

(65) Prior Publication Data

US 2004/0084242 A1 May 6, 2004

(30) Foreign Application Priority Data

Oct. 28, 2002 (JP) .................................... P.2002-312498

(51) Int. Cl.[7] ........................... H05K 5/02; H04R 1/02; H04R 1/22; H04R 1/28

(52) U.S. Cl. ....................... 181/148; 181/160; 181/156; 181/199; 381/349; 381/351

(58) Field of Search ................................ 181/148, 155, 181/160, 156, 145, 199; 381/349–351, 345, 163, 357, 335; 379/440, 432, 420.01, 420.02, 428.01, 433.02; 455/569.1, 575.1

(56) References Cited

U.S. PATENT DOCUMENTS

| | | | | | |
|---|---|---|---|---|---|
| 4,413,198 | A | * | 11/1983 | Bost | 381/349 |
| 4,549,631 | A | * | 10/1985 | Bose | 181/155 |
| 4,875,546 | A | * | 10/1989 | Krnan | 181/160 |
| 5,010,977 | A | * | 4/1991 | Furukawa et al. | 181/160 |
| 5,025,885 | A | * | 6/1991 | Froeschle | 181/156 |
| 5,184,332 | A | * | 2/1993 | Butler | 181/160 |
| 5,189,706 | A | * | 2/1993 | Saeki | 381/349 |
| 5,471,019 | A | * | 11/1995 | Maire | 181/156 |
| 5,590,208 | A | * | 12/1996 | Koyano et al. | 181/156 |
| 5,790,679 | A | * | 8/1998 | Hawker et al. | 381/163 |
| 6,002,949 | A | * | 12/1999 | Hawker et al. | 455/569.1 |
| 6,292,573 | B1 | * | 9/2001 | Zurek et al. | 381/335 |
| 6,389,145 | B2 | * | 5/2002 | Baumhauer et al. | 381/345 |
| 6,493,456 | B1 | * | 12/2002 | Hansson | 381/345 |
| 6,758,303 | B2 | * | 7/2004 | Zurek et al. | 181/155 |
| 2002/0051552 | A1 | * | 5/2002 | Schott | 381/349 |

FOREIGN PATENT DOCUMENTS

| | | | | | |
|---|---|---|---|---|---|
| JP | 1-16155 | Y | | 5/1989 | |
| JP | 04035198 | A | * | 2/1992 | H04R/1/28 |
| JP | 04301998 | A | * | 10/1992 | H04R/1/28 |
| JP | 9-149494 | A | | 6/1997 | |

* cited by examiner

*Primary Examiner*—Edgardo San Martin
(74) *Attorney, Agent, or Firm*—Sughrue Mion, PLLC

(57) ABSTRACT

An electromagnetic electroacoustic transducer, includes: a diaphragm; a magnet; an electromagnetic coil; and a casing for storing the diaphragm, the magnet and the electromagnetic coil therein. The case has at least one first sound emitting hole through which a front space on a front surface of the diaphragm in the casing communicates with a front outer space in front of the casing and at least one second sound emitting hole through which a rear space on a rear surface of the diaphragm in the casing communicates with the front outer space in front of the casing. A resonant frequency Fv2 of the rear space is set at a value in the range: F0<Fv2≦Fv1 in which F0 is a resonant frequency of the diaphragm, and Fv1 is a resonant frequency of the front space.

5 Claims, 8 Drawing Sheets

ELECTROMAGNETIC ELECTROACOUSTIC TRANSDUCER

BACKGROUND OF THE INVENTION

1. Field of the Invention

The present invention relates to an electromagnetic electroacoustic transducer and particularly to a configuration for attaining improvement in frequency characteristic of the electromagnetic electroacoustic transducer.

2. Background Art

Generally, an electromagnetic electroacoustic transducer includes a diaphragm made of a magnetic material, a magnet for generating a magnetostatic field to make the magnetostatic field act on the diaphragm, an electromagnetic coil for generating an oscillating magnetic field corresponding to an electric signal to make the oscillating magnetic field act on the diaphragm, and a casing for storing the diaphragm, the magnet and the electromagnetic coil therein. The electromagnetic electroacoustic transducer is formed so that an electric signal is converted into an acoustic signal by an electromagnetic transducer function.

In the electromagnetic electroacoustic transducer, a sound emitting hole through which a front space on a front surface of the diaphragm communicates with a front outer space in front of the casing is formed in the casing so that sound generated by vibration of the diaphragm is radiated to the front outer space in front of the casing by the sound emitting hole. On this occasion, if a rear space on a rear surface of the diaphragm is closed, sound pressure has a tendency toward decrease because an air damping effect prevents the diaphragm from vibrating sufficiently up to its vibration limit. Particularly when the size of the electromagnetic electroacoustic transducer is reduced, this tendency becomes strong.

Therefore, for example, as described in JPA9-149494, there has been heretofore proposed an idea that a second sound emitting hole through which a rear space on a rear surface of the diaphragm communicates with an outer space outside the casing is additionally formed in the casing to reduce air pressure of the rear space to thereby prevent reduction of sound pressure.

On this occasion, when the second sound emitting hole is formed so as to communicate with a front outer space in front of the casing, for example, as described in JPY1-16155, improvement in sound pressure can be attained by a resonance effect of the rear space on the rear surface of the diaphragm.

In JPY1-16155, no description is made on specific configuration for obtaining the resonance effect of the rear space on the rear surface of the diaphragm. On this occasion, a sufficient resonance effect cannot be obtained by only making the second sound emitting hole communicate with the front outer space in front of the casing, so that improvement in frequency characteristic of the electromagnetic electroacoustic transducer cannot be attained.

SUMMARY OF THE INVENTION

The invention is developed in consideration of such circumstances and an object of the invention is to provide an electromagnetic electroacoustic transducer effectively using a resonance effect of a rear space on a rear surface of a diaphragm for attaining improvement in frequency characteristic.

To achieve the object, the invention provides an electromagnetic electroacoustic transducer, including: a diaphragm made of a magnetic material; a magnet for generating a magnetostatic field to make the magnetostatic field act on said diaphragm; an electromagnetic coil for generating an oscillating magnetic field corresponding to an electric signal to make the oscillating magnetic field act on the diaphragm; and a casing for storing the diaphragm, the magnet and the electromagnetic coil therein; wherein the case has at least one first sound emitting hole through which a front space on a front surface of the diaphragm in the casing communicates with a front outer space in front of the casing and at least one second sound emitting hole through which a rear space on a rear surface of the diaphragm in the casing communicates with the front outer space in front of the casing; and a resonant frequency Fv2 of the rear space is set at a value in the range:

$$F0<Fv2\leqq Fv1$$

in which F0 is a resonant frequency of the diaphragm, and Fv1 is a resonant frequency of the front space.

The specific configuration of the "first sound emitting hole", such as the place where the first sound emitting hole is formed, the opening shape of the first sound emitting hole, the opening size of the first sound emitting hole and the number of first sound emitting holes to be formed, is not particularly limited if the first sound emitting hole is formed so that the front space on the front surface of the diaphragm in the casing can communicate with the front outer space in front of the casing through the first sound emitting hole.

The specific configuration of the "second sound emitting hole", such as the place where the second sound emitting hole is formed, the opening shape of the second sound emitting hole, the opening size of the second sound emitting hole and the number of second sound emitting holes to be formed, is not particularly limited if the second sound emitting hole is formed so that the rear space on the rear surface of the diaphragm in the casing can communicate with the front outer space in front of the casing through the second sound emitting hole, and that the resonant frequency Fv2 of the rear space can be set at a value in the aforementioned range.

As described in the aforementioned configuration, the electromagnetic electroacoustic transducer according to the invention is formed in the casing in which the diaphragm, the magnet and the electromagnetic coil. In the casing, at least one first sound emitting hole through which a front space on a front surface of the diaphragm communicates with a front outer space in front of the casing and at least one second sound emitting hole through which a rear space on a rear surface of the diaphragm communicates with the front outer space in front of the casing are formed. The resonant frequency Fv2 of the rear space on the rear surface of the diaphragm is set a value in the range: $F0<Fv2\leqq Fv1$ in which F0 is the resonant frequency of the diaphragm, and Fv1 is the resonant frequency of the front space on the front surface of the diaphragm. Accordingly, the following operation and effect can be obtained.

That is, generally, in the electromagnetic electroacoustic transducer, a frequency slightly higher than the resonant frequency F0 of the diaphragm is set as a standard frequency Fs which is a standard for activating the electromagnetic electroacoustic transducer. Sound pressure obtained by activating of the electromagnetic electroacoustic transducer at the standard frequency Fs is generated by superposition of a second harmonic of 2×Fs, a third harmonic of 3×Fs and further higher harmonics on a fundamental wave component (first harmonic) of the standard frequency Fs.

Generally, in the electromagnetic electroacoustic transducer, the resonant frequency Fv1 of the front space on the front surface of the diaphragm is set at a value higher by a certain degree than the resonant frequency F0 of the diaphragm. The resonant frequency Fv1 may be set at a suitable value so that improvement of sound pressure or band spreading of frequency characteristic at the standard frequency Fs can be attained.

Therefore, when the resonant frequency Fv2 of the rear space on the rear surface of the diaphragm is set at a value higher than the resonant frequency F0 of the diaphragm but not higher than the resonant frequency Fv1 of the front space on the front surface of the diaphragm according to the invention, a drop in sound pressure at a frequency band between the resonant frequency F0 and the resonant frequency Fv1 can be corrected to attain flattening of frequency characteristic. Furthermore, when the resonant frequency Fv2 is set as described above, flattening of frequency characteristic in a frequency band lower than the resonant frequency F0 can also be attained by a function of superposition of harmonics of the resonant frequency Fv2.

As described above, in accordance with the invention, the resonance effect of the rear space on the rear surface of the diaphragm can be used effectively for attaining improvement in frequency characteristic of the electromagnetic electroacoustic transducer.

On this occasion, when the resonant frequency Fv2 is set at a value in the range $Fv2 \geqq 1.2 \times F0$, a drop in sound pressure in the frequency band between the resonant frequency F0 and the resonant frequency Fv1 can be corrected effectively to attain sufficient flattening of frequency characteristic.

In this configuration, when the resonant frequency Fv2 is set at a value near a frequency equal to an integral multiple of the resonant frequency F0, sound pressure at the resonant frequency F0 can be improved by a function of superposition of harmonics of the resonant frequency Fv2 to thereby improve sound pressure at the standard frequency Fs.

In this configuration, when the resonant frequency Fv1 is set at a value near a frequency three times as high as the resonant frequency F0 while the resonant frequency Fv2 is set at a value near a frequency twice as high as the resonant frequency F0, sound pressure at the resonant frequency F0 can be improved greatly by a function of superposition of the third harmonic with the resonant frequency Fv1 and the second harmonic with the resonant frequency Fv2 to thereby improve sound pressure at the standard frequency Fs greatly. Furthermore, when the resonant frequencies Fv1 and Fv2 are set as described above, a drop in sound pressure in the frequency band between the resonant frequency F0 and the resonant frequency Fv1 can be corrected greatly to attain flattening of frequency characteristic effectively. In addition, in this case, flattening of frequency characteristic in a frequency band lower than the resonant frequency F0 can also be attained effectively by a function of superposition of higher harmonics of the resonant frequency Fv2.

BRIEF DESCRIPTION OF THE DRAWINGS

The present invention may be more readily described with reference to the accompanying drawings.

DETAILED DESCRIPTION OF THE PREFERRED EMBODIMENTS

An embodiment of the invention will be described below with reference to the drawings.

Figure 1:
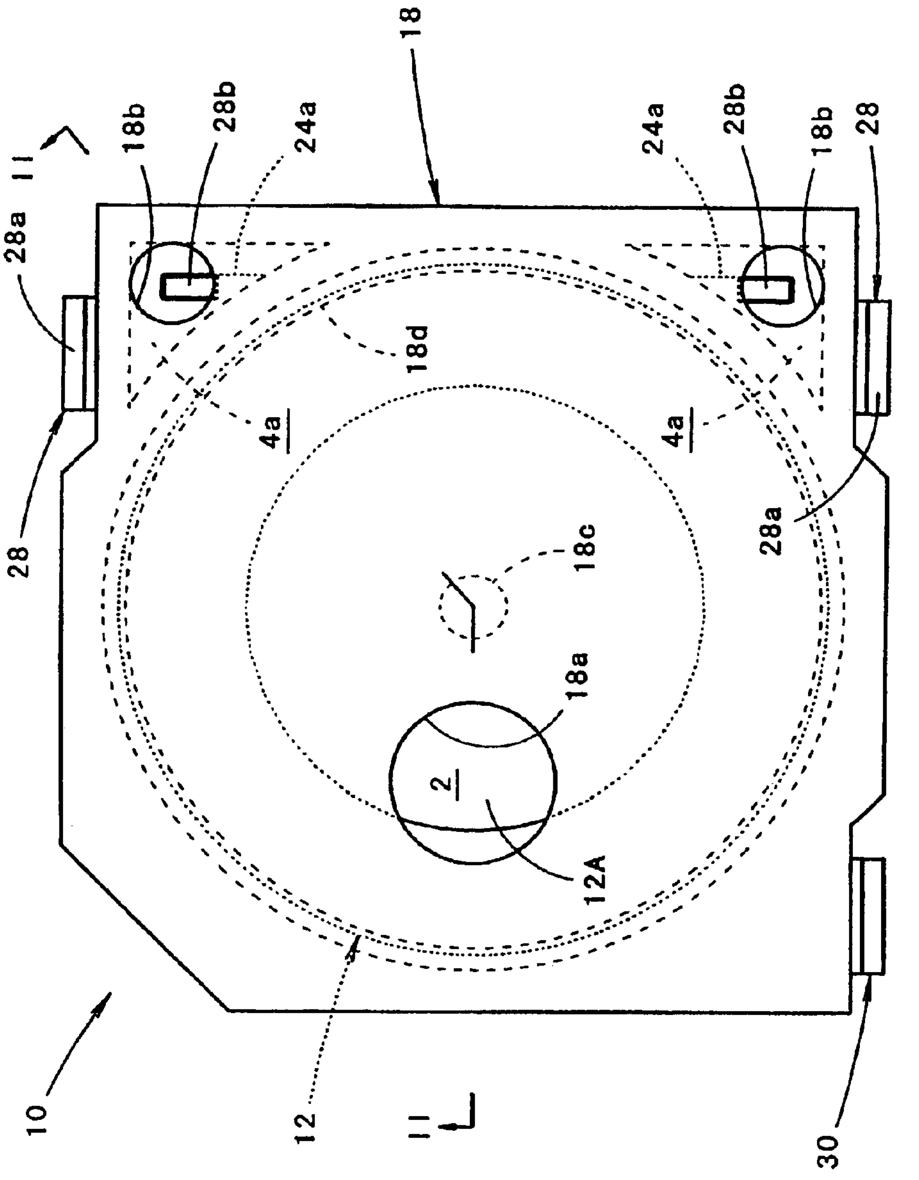
FIG. 1 is a front view of an electromagnetic electroacoustic transducer according to an embodiment of the invention in the case where the electromagnetic electroacoustic transducer is disposed so as to face upward.
Figure 2:
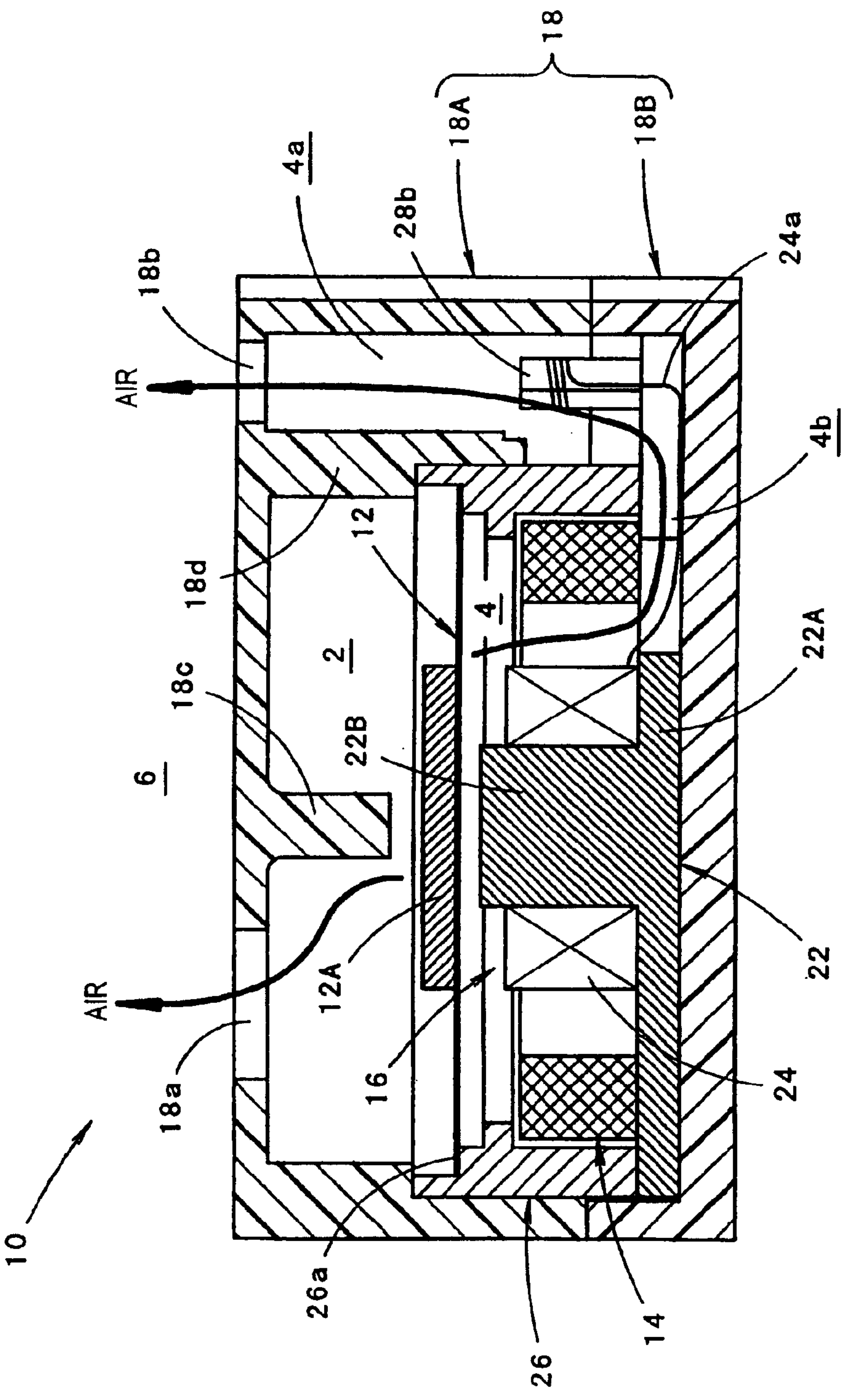
FIG. 2 is a detailed sectional view taken along the line II—II in FIG. 1.
Figure 3:
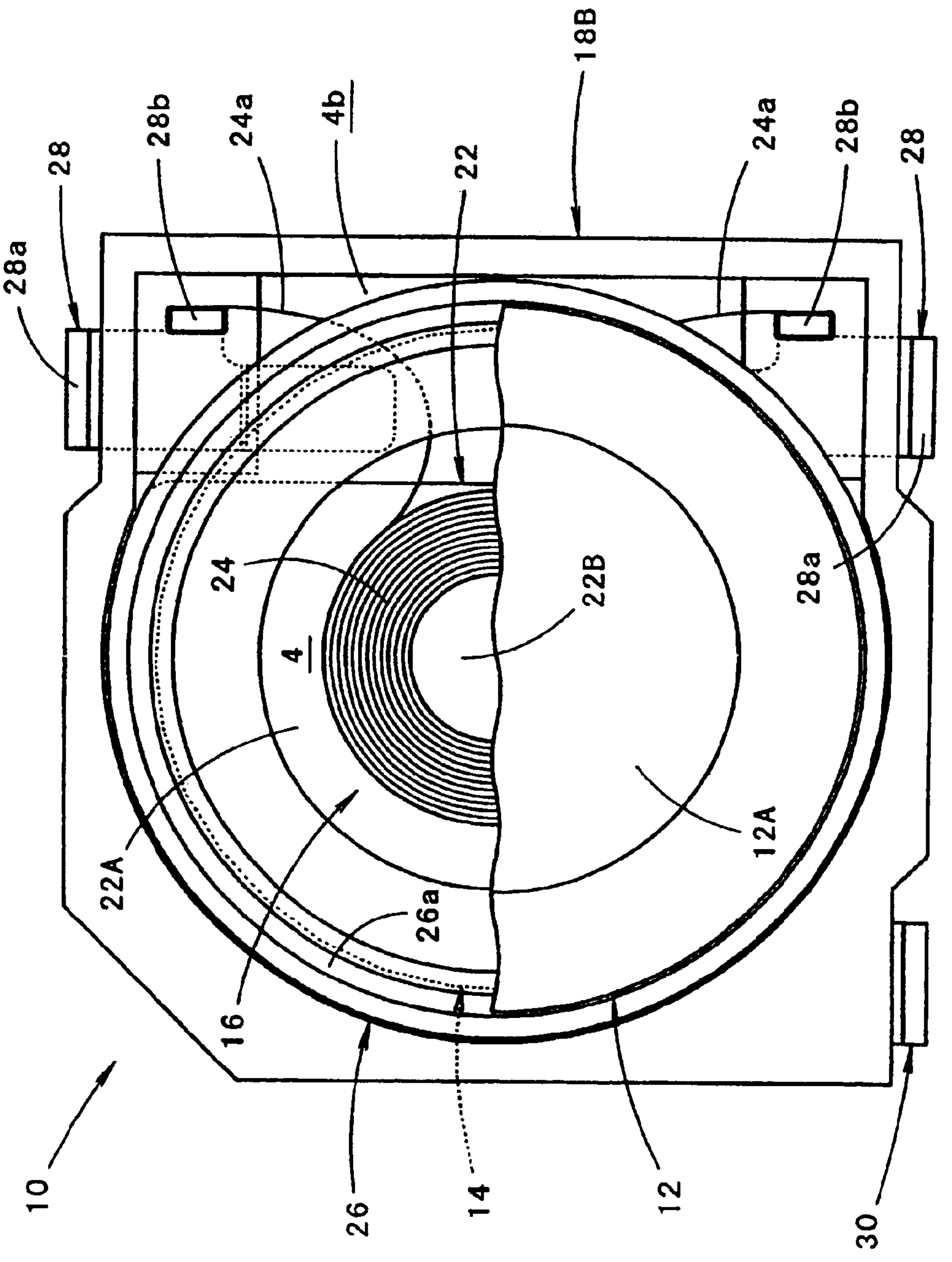
FIG. 3 is a front view of the electromagnetic electroacoustic transducer in the case where a front casing is removed.

FIG. 1 is a front view of an electromagnetic electroacoustic transducer 10 according to an embodiment of the invention in the case where the electromagnetic electroacoustic transducer 10 is disposed so as to face upward. FIG. 2 is a sectional view taken along the line II—II in FIG. 1. FIG. 3 is a front view of the electromagnetic electroacoustic transducer 10 in the case where a front casing 18A is removed.

As shown in FIGS. 1 to 3, the electromagnetic electroacoustic transducer 10 according to this embodiment includes a diaphragm 12 made of a magnetic material, a magnet 14 for generating a magnetostatic field to make the magnetostatic field act on the diaphragm 12, an electromagnetic coil 16 for generating an oscillating magnetic field corresponding to an electric signal to make the oscillating magnetic field act on the diaphragm 12, and a casing 18 in which the diaphragm 12, the magnet 14 and the electromagnetic coil 16 are stored. The electromagnetic electroacoustic transducer 10 is formed so that an electric signal is converted into an acoustic signal by an electromagnetic transducer function.

The casing 18 includes a front casing 18A, and a rear casing 18B. The casing 18 is substantially square-shaped, having several millimeters sides but having one chamfered corner in front view.

A pole piece 22 is mounted on an inner rear surface of the rear casing 18B. The pole piece 22 has a plate-shaped base 22A in the shape of near a circle whose arc is partially cut, and an iron core 22B formed so as to be integrated with the base 22A and protrude frontward from the center portion of the base 22A. The iron core 22B of the pole piece 22 is wound with a coil 24 to thereby form the electromagnetic coil 16.

The ring-shaped magnet 14 is disposed on the outer circumferential side of the coil 24 on a front surface of the base 22A of the pole piece 22 so that an annular space is formed between the magnet 14 and the coil 24. A retaining ring 26 for retaining the magnet 14 concentrically with the iron core 22B is disposed on the outer circumferential side of the magnet 14.

A concave step portion 26*a* is formed on the whole circumference at an inner circumferential front end portion of the retaining ring 26. An outer circumferential edge portion of the diaphragm 12 is supported at the concave step portion 26*a*. The diaphragm 12 has a magnetic piece 12A as an additional mass in its front center portion. The diaphragm 12 is disposed so that the diaphragm 12 is attracted rearward and slightly warped by the action of a magnetostatic field formed on the basis of magnetic flux provided from the magnet 14.

A pin 18*c* for preventing the diaphragm 12 from dropping out because of impact load or other reasons at the time of the fall of the electromagnetic electroacoustic transducer 10 is formed in the front casing 18A so as to face the magnetic piece 12A of the diaphragm 12. An annular wall 18d for positioning and fixing the retaining ring 26 concentrically with the iron core 22B is formed in the front casing 18A.

First and second sound emitting holes 18*a* and 18*b* are formed in a front wall of the front casing 18A. In this embodiment, one first sound emitting hole 18*a* is formed at a place near the pin 18*c* whereas two second sound emitting holes 18*b* are formed in two corner portions respectively. The first sound emitting hole 18*a* is provided so that a front space 2 on a front surface of the diaphragm 12 in the casing 18 communicates with a front outer space 6 in front of the casing 18 through the first sound emitting hole 18*a*. The second sound emitting holes 18*b* are provided so that a rear space 4 on a rear surface of the diaphragm 12 in the casing 18 communicates with the front outer space 6 through the second sound emitting holes 18*b*. Two spaces located in the corner portions on the outer circumferential side of the annular wall 18*d* form communicating spaces 4*a* in the front casing 18A so that the second sound emitting holes 18*b* communicate with the rear space 4 through the communicating spaces 4*a*. Incidentally, the communicating spaces 4*a* communicate with the rear space 4 through a communicating space 4*b* which is formed on a side of the cut portion of the base 22A of the pole piece 22 so as to have a thickness equal to the thickness of the base 22A.

Lead terminals 28 are provided in two corner portions of the rear casing 18B corresponding to the aforementioned two corner portions. The lead terminals 28 are formed so as to be integrated with the rear casing 18B in a state in which the lead terminals 28 are partially buried in the rear casing 18B by insert molding. One end portion 28*a* of each lead terminal 28 is formed so as to extend from a rear wall outer surface of the rear casing 18B to a side wall outer surface of the rear casing 18B. The other end portion 28*b* of each lead terminal 28 is formed so as to protrude from a rear wall inner surface of the rear casing 18B toward the communicating space 4*a* in each corner portion of the rear casing 18B. A pair of coil terminals 24*a* led out from the coil 24 are soldered to the other end portions 28*b* of the lead terminals 28 respectively in a state in which the pair of coil terminals 24*a* are tied to the other end portions 28*b* respectively. Incidentally, a dummy terminal 30 is provided in another corner portion of the rear casing 18B.

In the electromagnetic electroacoustic transducer 10 according to this embodiment, when a current is applied to the coil 24 through the pair of lead terminals 28, the iron core 22B serves as an electromagnet for generating a magnetic field at its end. On this occasion, if the magnetic pole generated in the iron core 22B by the coil 24 is opposite to the magnetic pole generated in the diaphragm 12 by the magnet 14, the diaphragm 12 is attracted toward the iron core 22B. On the other hand, if the magnetic pole generated in the iron core 22B by the coil 24 is equal to the magnetic pole generated in the diaphragm 12 by the magnet 14, the diaphragm 12 and the iron core 22B repel each other. Accordingly, when an electric signal intermittent with a predetermined frequency is input into the coil 24, an intermittent magnetic field is generated at an end of the iron core 22B to vibrate the diaphragm 12 to thereby produce sound with a sound pressure corresponding to the amplitude of vibration.

The electromagnetic electroacoustic transducer 10 is formed so that the sound produced by vibration of the diaphragm 12 is radiated from the front space 2 to the front outer space 6 in front of the casing 18 through the first sound emitting hole 18*a* and from the rear space 4 to the front outer space 6 in front of the casing 18 through the second sound emitting holes 18*b*. In this manner, improvement in sound pressure is attained by the resonance effect of the front space 2 and the resonance effect of the rear space 4.

On this occasion, the resonant frequency Fv1 of the front space 2 is set at a value three times as high as the resonant frequency F0 of the diaphragm 12, and the resonant frequency Fv2 of the rear space 4 is set at a value twice as high as the resonant frequency F0 of the diaphragm 12. Specifically, the resonant frequency F0 of the diaphragm 12, the resonant frequency Fv1 of the front space 2 and the resonant frequency Fv2 of the rear space 4 are set at 4,000 Hz, 12,000 Hz and 8,000 Hz respectively.

The standard frequency Fs of the electromagnetic electroacoustic transducer 10 is set at a value (e.g., about 4,200 Hz) slightly higher than the resonant frequency F0. This is based on the following reason. If the standard frequency Fs is selected to be in a frequency band lower than the resonant frequency F0, the sound pressure level in the neighborhood of the resonant frequency F0 is reduced suddenly when the standard frequency Fs becomes slightly lower than the resonant frequency F0. On the contrary, if the standard frequency Fs is selected to be in a frequency band higher than the resonant frequency F0, a drop in sound pressure level in the neighborhood of the resonant frequency F0 is gentle. Thus, setting of the standard frequency Fs at a value slightly higher than the resonant frequency F0 results in reduction of the influence of the shift of the resonant frequency F0 on the drop in sound pressure. Accordingly, the sound pressure of the electromagnetic electroacoustic transducer 10 can be stabilized to obtain a good yield of products.

Incidentally, the resonant frequencies Fv1 and Fv2 can be set at required values, for example, by suitable adjustment of opening sizes of the first and second sound emitting holes 18*a* and 18*b*.

Figure 6:
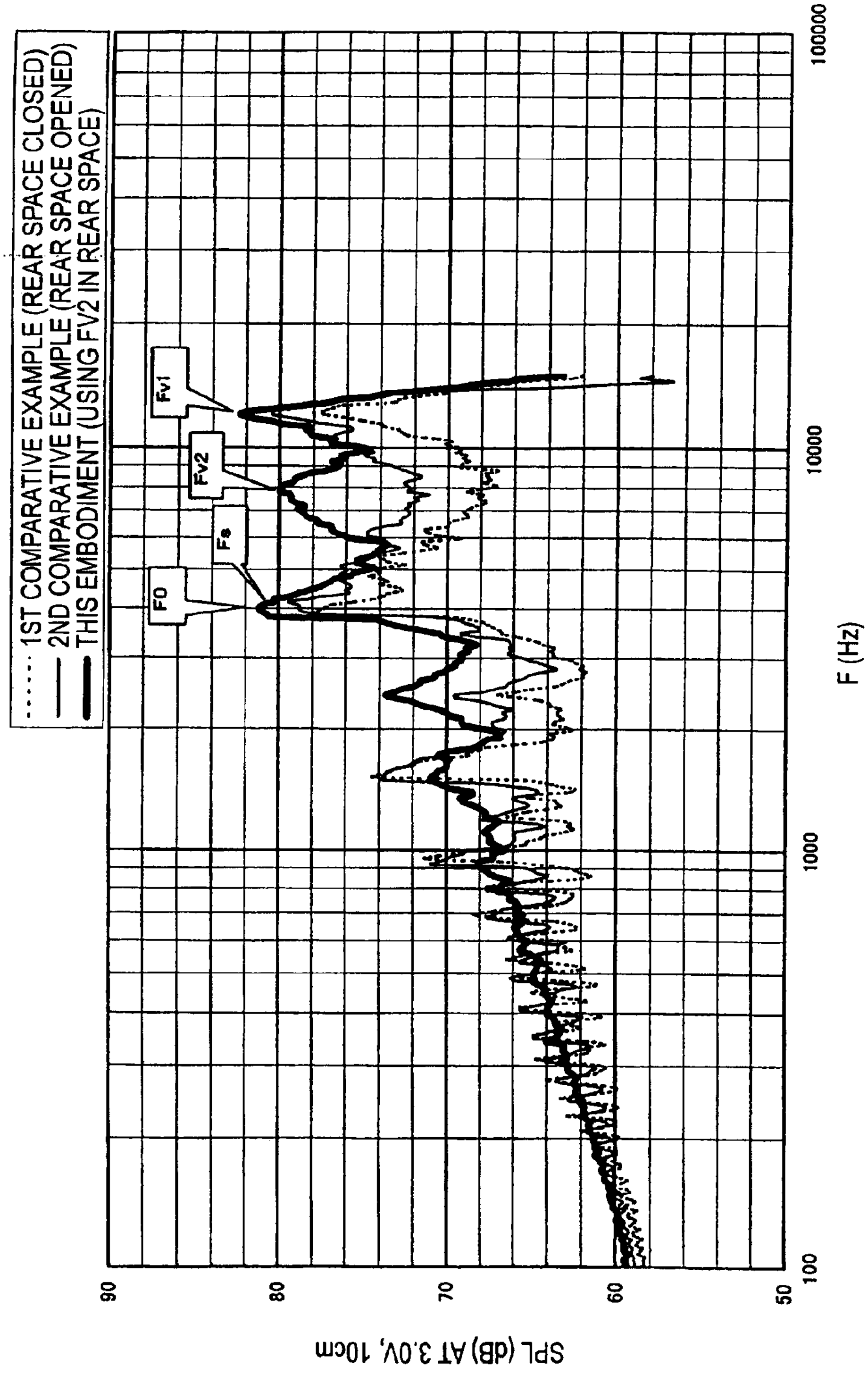
FIG. 6 is a graph showing a measured result of sound pressure level-frequency characteristic of the electromagnetic electroacoustic transducer in comparison with measured results of sound pressure-frequency characteristics of the first and second comparative examples.

FIG. 6 is a graph showing a measured result of sound pressure level-frequency characteristic of the electromagnetic electroacoustic transducer 10 according to this embodiment in comparison with measured results of sound pressure level-frequency characteristics of first and second comparative examples. The configurations of the first and second comparative examples will be described before the description of the graph.

Figure 4:
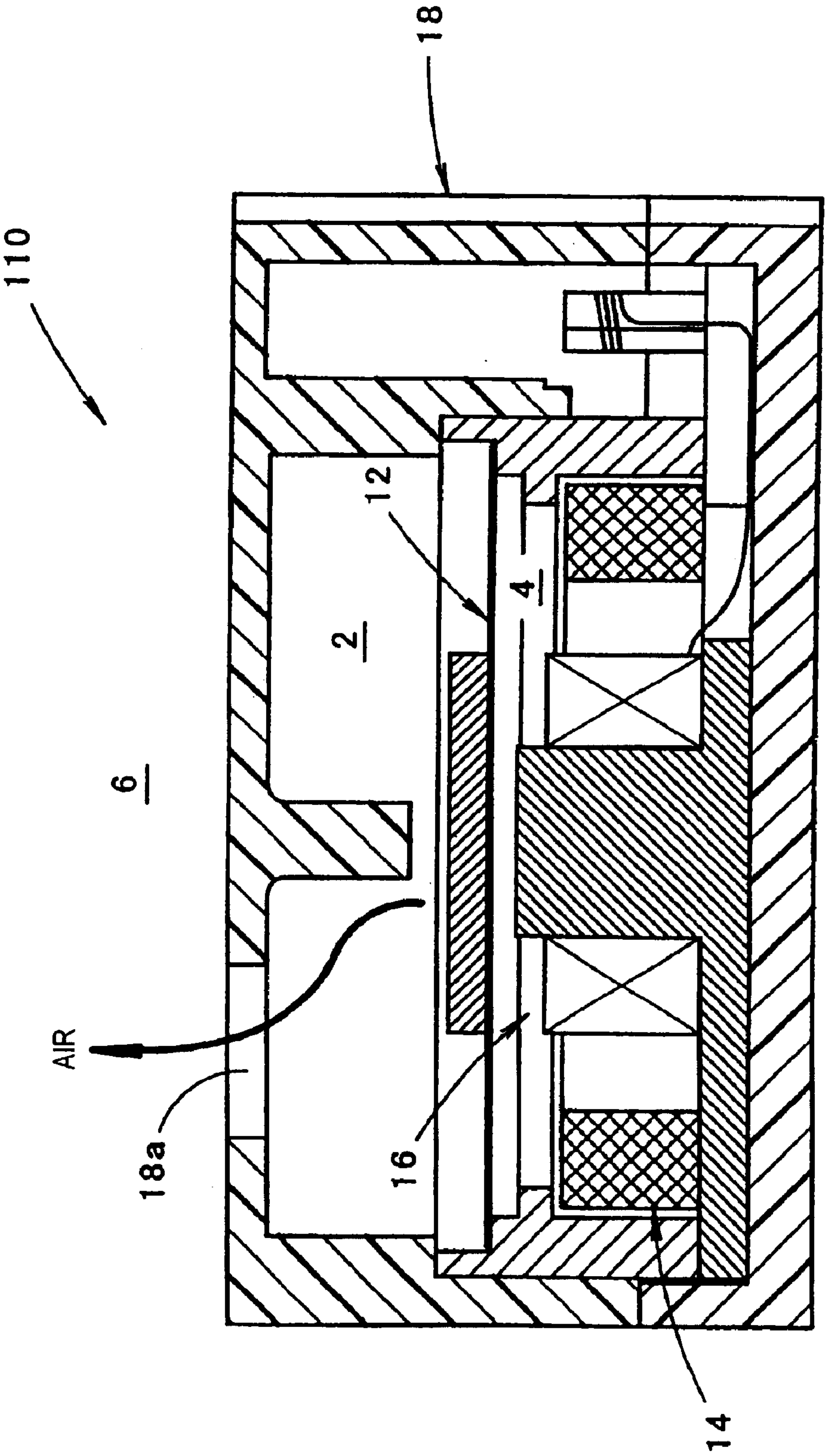
FIG. 4 is a detailed sectional view showing a first comparative example of the electromagnetic electroacoustic transducer.

The first comparative example assumes a prior art electromagnetic electroacoustic transducer having a closed rear space. As shown in FIG. 4, the electromagnetic electroacoustic transducer 110 according to the first comparative example has the same configuration as the electromagnetic electroacoustic transducer 10 according to this embodiment except that the rear space 4 is closed without formation of any second sound emitting holes 18*b*.

Figure 5:
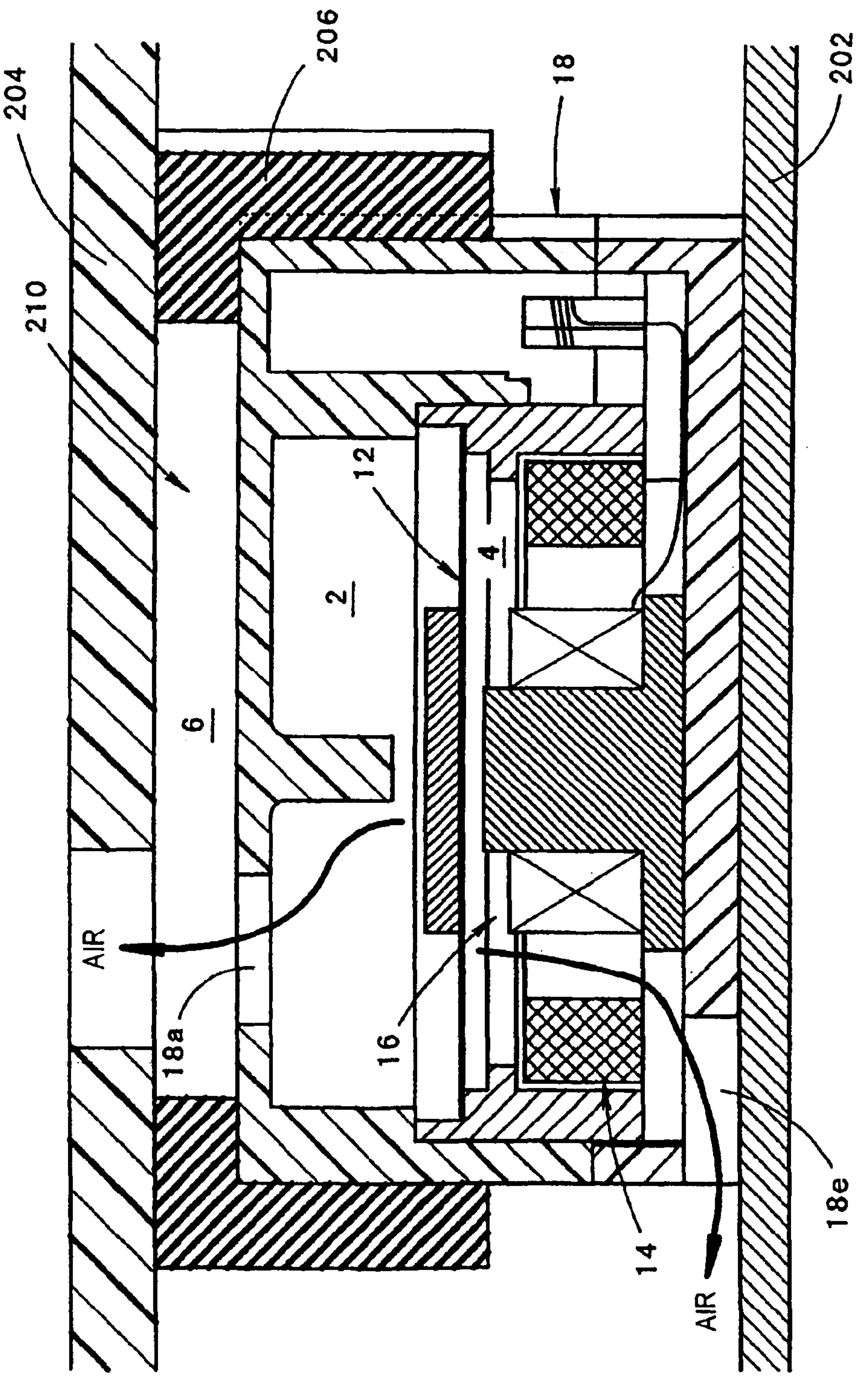
FIG. 5 is a detailed sectional view showing a second comparative example of the electromagnetic electroacoustic transducer.

On the other hand, the second comparative example assumes a prior art electromagnetic electroacoustic transducer having an opened rear space. As shown in FIG. 5, in the electromagnetic electroacoustic transducer 210 according to the second comparative example, a second sound emitting hole 18*e* is formed instead of the second sound emitting holes 18*b* of the electromagnetic electroacoustic transducer 10 according to this embodiment. The second sound emitting hole 18*e* is provided for reducing air pressure of the rear space 4 but not for making the rear space 4 communicate with the front outer space 6. In FIG. 5, the casing 18 of the electromagnetic electroacoustic transducer 210 mounted on a board 202 is brought into contact with a housing 204 of an external apparatus (e.g., a cellular phone) through a gasket 206 to thereby prevent the second sound emitting hole 18*e* from communicating with the front outer space 6.

In FIG. 6, the thick solid line curve shows sound pressure level-frequency characteristic of the electromagnetic electroacoustic transducer 10 according to this embodiment, the broken line curve shows sound pressure level-frequency characteristic of the electromagnetic electroacoustic transducer 110 according to the first comparative example, and the thin solid line curve shows sound pressure level-frequency characteristic of the electromagnetic electroacoustic transducer 210 according to the second comparative example.

As described above, the resonant frequency F0 of the diaphragm 12 and the resonant frequency Fv1 of the front space 2 are set at 4,000 Hz and 12,000 Hz respectively. Accordingly, each of the three curves in FIG. 6 has sound pressure peaks at in the neighborhoods of 4,000 Hz and 12,000 Hz.

In the electromagnetic electroacoustic transducer 110 according to the first comparative example, the rear space 4 is however closed so that the resonance effect of the rear space 4 cannot be obtained. For this reason, sound pressure in a frequency band between the resonant frequency F0 and the resonant frequency Fv1 is reduced remarkably. Furthermore, sound pressure is reduced as a whole because the air damping effect of the rear space 4 prevents the diaphragm 12 from vibrating sufficiently up to the vibration limit.

On the other hand, in the electromagnetic electroacoustic transducer 210 according to the second comparative example, the rear space 4 is opened by the second sound emitting hole 18*e* so that the influence of the air damping effect is eliminated. It is however impossible to obtain the resonance effect of the rear space 4 because the rear space 4 is isolated from the front outer space 6 in front of the casing 18. For this reason, sound pressure slightly higher than that in the first comparative example as a whole can be obtained but sound pressure in the frequency band between the resonant frequency F0 and the resonant frequency Fv1 is reduced remarkably.

On the contrary, in the electromagnetic electroacoustic transducer 10 according to this embodiment, the resonance effect of the rear space 4 can be obtained because the rear space 4 communicates with the front outer space 6 through the second sound emitting holes 18*b*. On this occasion, because the resonant frequency Fv2 of the rear space 4 is set at a median between the resonant frequency F0 and the resonant frequency Fv1, the electromagnetic electroacoustic transducer 10 according to this embodiment has a sound pressure peak in the neighborhood of 8,000 Hz as well as sound pressure peaks in the neighborhoods of 4,000 Hz and 12,000 Hz. For this reason, reduction in sound pressure in the frequency band between the resonant frequency F0 and the resonant frequency Fv1 is corrected greatly.

Figure 7:
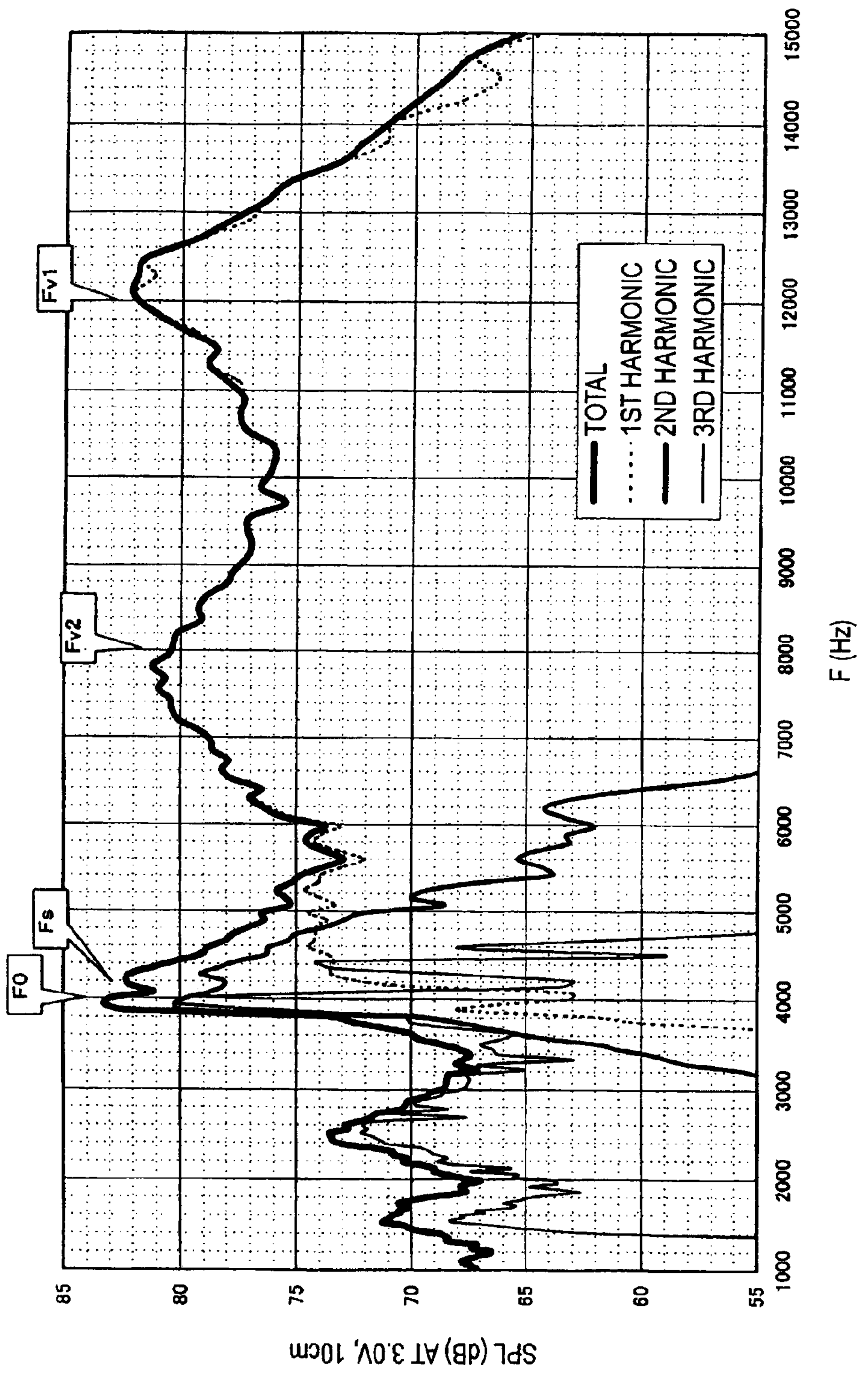
FIG. 7 is a graph showing a measured result of sound pressure level-frequency characteristic of the electromagnetic electroacoustic transducer in connection with waveform components of the sound pressure level-frequency characteristic.
Figure 8:
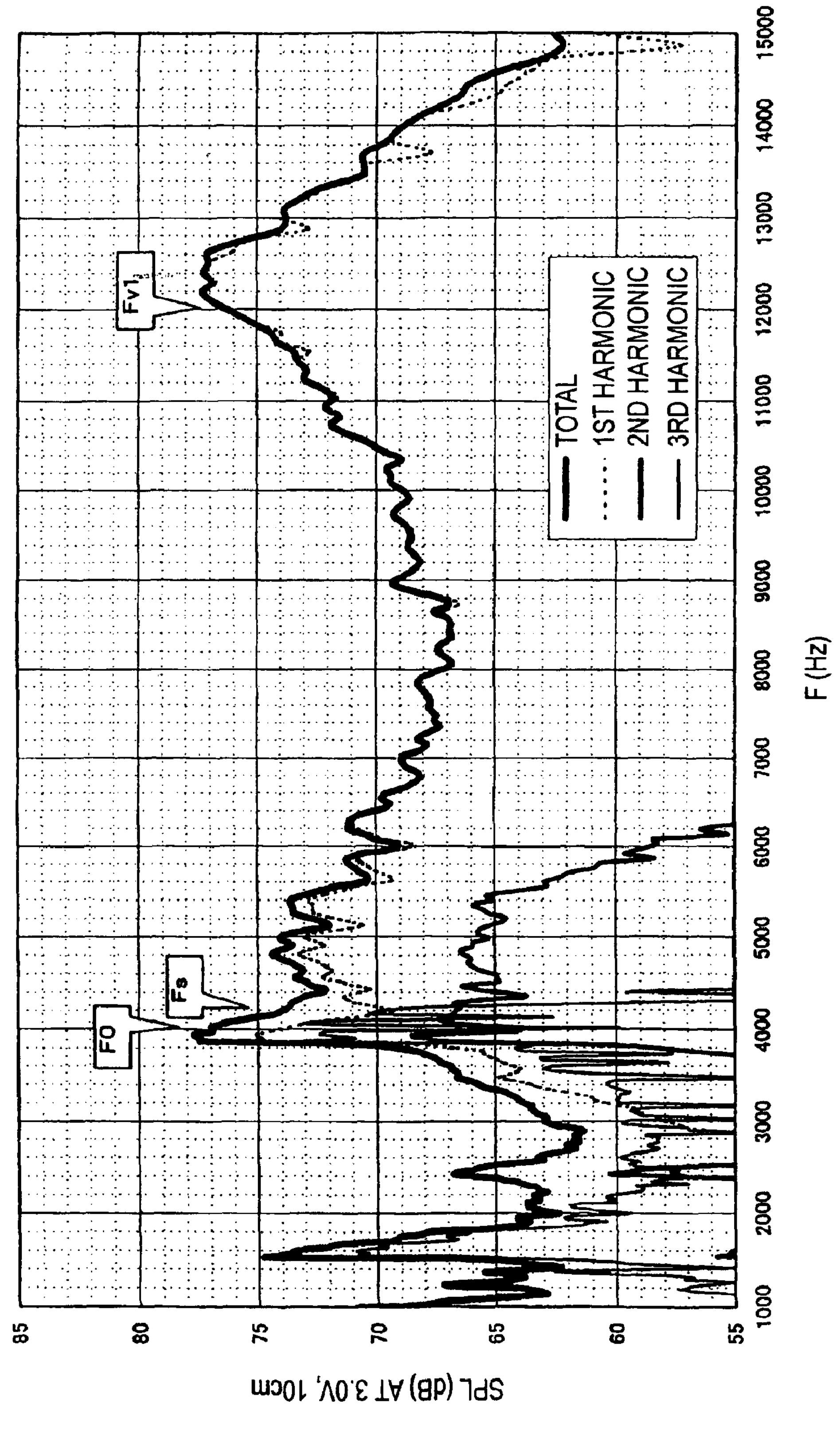
FIG. 8 is a graph showing a measured result of sound pressure level-frequency characteristic of the first comparative example in connection with waveform components of the sound pressure level-frequency characteristic.

FIG. 7 is a graph showing the measured result of sound pressure level-frequency characteristic of the electromagnetic electroacoustic transducer 10 according to this embodiment as shown in FIG. 6 in connection with waveform components of the sound pressure level-frequency characteristic. FIG. 8 is a graph showing the measured result of sound pressure level-frequency characteristic of the electromagnetic electroacoustic transducer 110 according to the first comparative example as shown in FIG. 6 in connection with waveform components of the sound pressure level-frequency characteristic.

As shown in each of FIGS. 7 and 8, the sound pressure level-frequency characteristic of each electromagnetic electroacoustic transducer 10, 110 is obtained by superposition of a fundamental wave component (first harmonic) represented by the broken line, a second harmonic represented by the slightly thin broken line, a third harmonic represented by the thin solid line and further higher harmonics. The sound pressure produced at the time of activating of each electromagnetic electroacoustic transducer 10, 110 at the resonant frequency F0 is obtained by superposition of the second harmonic of 2×F0, the third harmonic of 3×F0 and further higher harmonics on the fundamental wave component of the resonant frequency F0.

As shown in FIG. 7, in the electromagnetic electroacoustic transducer 10 according to this embodiment, because the resonant frequencies Fv1 and Fv2 are set at 3×F0 and 2×F0 respectively, a sufficiently high sound pressure at the resonant frequency F0 can be ensured on the basis of the third harmonic with the resonant frequency Fv1 and the second harmonic with the resonant frequency Fv2. Accordingly, when the electromagnetic electroacoustic transducer 10 is activated at the standard frequency Fs slightly higher than the resonant frequency F0, a sufficiently high sound pressure can be ensured because the third harmonic with the resonant frequency Fv1 and the second harmonic with the resonant frequency Fv2 are superposed on the fundamental wave component.

On the contrary, as shown in FIG. 8, in the electromagnetic electroacoustic transducer 110 according to the first comparative example, only the third harmonic with the resonant frequency Fv1 set at 3×F0 is superposed on the fundamental wave component because the resonance effect of the rear space 4 cannot be obtained. For this reason, a sufficient high sound pressure at the resonant frequency F0 cannot be ensured. Accordingly, a sufficiently high sound pressure at the standard frequency Fs cannot be ensured.

As described above, the electromagnetic electroacoustic transducer 10 according to this embodiment has a sound pressure peak at the resonant frequency Fv2 set at a median between the resonant frequency F0 and the resonant frequency Fv1, so that reduction in sound pressure in the frequency band between the resonant frequency F0 and the resonant frequency Fv1 is corrected greatly. As shown in FIG. 6, even in a frequency band lower than the resonant frequency F0, flattening of frequency characteristic in a wide range can be attained by superposition of harmonics of the resonant frequency Fv2. Accordingly, in the electromagnetic electroacoustic transducer 10 according to this embodiment, when, for example, a melodic alarm is sounded, the melodic alarm can be reproduced smoothly with a small difference between the high level and the low level of sound pressure.

On the contrary, in the electromagnetic electroacoustic transducer 110 according to the first comparative example, a frequency band lower than the resonant frequency F0 is affected by reduction in sound pressure in the frequency band between the resonant frequency F0 and the resonant frequency Fv1. For this reason, the difference between the high level and the low level of sound pressure becomes large. Accordingly, melody reproduction cannot be made smoothly with a small difference between the high level and the low level of sound pressure.

In this respect, the electromagnetic electroacoustic transducer 210 according to the second comparative example has substantially the same tendency though the electromagnetic electroacoustic transducer 210 according to the second comparative example is more or less improved compared with the electromagnetic electroacoustic transducer 110 according to the first comparative example.

As described above in detail, the electromagnetic electroacoustic transducer 10 according to this embodiment is formed so that the first sound emitting hole 18*a* for making the front space 2 on the front surface of the diaphragm 12 communicate with the front outer space 6 in front of the casing 18 and the second sound emitting holes 18*b* for making the rear space 4 on the rear surface of the diaphragm 12 communicate with the front outer space 6 in front of the casing 18 are formed in the casing 18 in which the diaphragm 12, the magnet 14 and the electromagnetic coil 16 are stored. The resonant frequency Fv2 of the rear space 4 on the rear surface of the diaphragm 12 is set at a value in the range $F0<Fv2\leqq Fv1$ in which F0 is the resonant frequency of the diaphragm 12, and Fv1 is the resonant frequency of the front space 2 on the front surface of the diaphragm 12. Accordingly, reduction in sound pressure in the frequency band between the resonant frequency F0 and the resonant frequency Fv1 can be corrected to thereby attain flattening of frequency characteristic. Furthermore, when the resonant frequencies are set in this manner, flattening of frequency characteristic even in a frequency band lower than the resonant frequency F0 can be attained by a function of superposition of harmonics of the resonant frequency Fv2.

As described above, in accordance with this embodiment, the resonance effect of the rear space 4 on the rear surface of the diaphragm 12 can be effectively used for attaining improvement in frequency characteristic of the electromagnetic electroacoustic transducer 10.

Particularly in this embodiment, the resonant frequency Fv1 is set at a value three times as high as the resonant frequency F0, and the resonant frequency Fv2 is set at a value twice as high as the resonant frequency F0. Accordingly, sound pressure at the resonant frequency F0 can be improved greatly by a function of superposition of the third harmonic with the resonant frequency Fv1 and the second harmonic with the resonant frequency Fv2. Accordingly, sound pressure at the standard frequency Fs can be improved greatly. Furthermore, when the resonant frequencies are set in this manner, reduction in sound pressure in the frequency band between the resonant frequency F0 and the resonant frequency Fv1 can be corrected greatly to thereby attain flattening of frequency characteristic effectively. In addition, flattening of frequency characteristic even in a frequency band lower than the resonant frequency F0 can be attained effectively by a function of superposition of higher harmonics of the resonant frequency Fv2.

Particularly when flattening of frequency characteristic of the electromagnetic electroacoustic transducer is attained according to this embodiment, an electroacoustic transducer having the same flat frequency characteristic as an electrodynamic electroacoustic transducer can be achieved while the characteristic of the electromagnetic electroacoustic transducer higher in sound pressure than the electrodynamic electroacoustic transducer is maintained.

Although this embodiment has been described on the case where the resonant frequencies Fv1 and Fv2 are set at a frequency three times as high as the resonant frequency F0 and a frequency twice as high as the resonant frequency F0 respectively, the invention may be also applied to the case where the resonant frequencies Fv1 and Fv2 are not accurately set at frequencies equal to integral multiples of F0. For example, substantially the same operation and effect as in this embodiment can be obtained if each resonant frequency Fv1, Fv2 is set at a value near a frequency equal to an integral multiple of F0, specifically at a value in a range of ±10% as high as a frequency equal to an integral multiple of F0.

Furthermore, when the resonant frequency Fv2 is set not at a value near a frequency twice as high as the resonant frequency F0 but at a value near the resonant frequency F0 or a value near a frequency three times as high as the resonant frequency F0, sound pressure at the resonant frequency F0 can be improved by a function of superposition of the resonant frequency Fv2 or harmonics of the resonant frequency Fv2. Accordingly, sound pressure at the standard frequency Fs can be improved.

Even in the case where the resonant frequency Fv2 is not set at a value near a frequency equal to an integral multiple of the resonant frequency F0, reduction in sound pressure in the frequency band between the resonant frequency F0 and the resonant frequency Fv1 can be improved effectively to attain flattening of frequency characteristic sufficiently if the resonant frequency Fv2 is set at a value in the range $Fv2\geqq 1.2\times F0$.

Assuming now that the resonant frequency Fv2 is set at a value satisfying the relation $F0\leqq Fv2<1.2\times F0$, then the resonant frequency Fv2 may superpose on the resonant frequency F0 or the standard frequency Fs. As a result, frequency characteristic is so peaky that sound pressure is high only in the neighborhood of the resonant frequency F0. Accordingly, flattening of frequency characteristic cannot be attained. As described above, this is because sound pressure at the resonant frequency F0 is made high by the effect of superposition when the resonant frequency Fv2 is set at a value in a range of ±10% as high as an integral multiple (in this case, $Fv2=F0$) of the resonant frequency F0.

Sound pressure in a frequency band lower than the resonant frequency F0 is generated by superposition of harmonics in a frequency band not lower than the resonant frequency F0 because the sound pressure level of the fundamental wave component is reduced extremely. For this reason, if the resonant frequency Fv2 is set at a value satisfying the relation $Fv2<F0$, flattening of frequency characteristic in all frequency bands cannot be attained because sound pressure of superposed harmonics is reduced when sound pressure in the frequency band between the resonant frequency F0 and the resonant frequency Fv1 is reduced remarkably. Furthermore, if the resonant frequency Fv2 is set at a value in the range $Fv2<F0$, the sound pressure level as a whole is finally reduced because the resonance effect at the resonant frequency Fv2 is not superposed on the standard frequency Fs when the transducer is activated at the standard frequency Fs.

In this respect, when the resonant frequency Fv2 is set at a value in the range $Fv2\geqq 1.2\times F0$ with respect to the resonant frequency F0, the aforementioned operation and effect can be obtained.

The relation between the resonant frequency Fv1 and the resonant frequency Fv2 may be set as follows. That is, when the resonant frequency Fv1 is set at a value in a range of ±10% as high as an integral multiple of the resonant frequency F0, the resonance effect at the resonant frequency Fv1 can appear. Accordingly, when the resonant frequency Fv2 is set at a value in the range Fv2<0.8×Fv1 with respect to the resonant frequency Fv1, flattening of frequency characteristic can be attained more effectively.

Although the electromagnetic electroacoustic transducer 10 according to this embodiment is formed so that the first and second sound emitting holes 18*a* and 18*b* are formed in the front wall of the front casing 18A, the first and second sound emitting holes 18*a* and 18*b* may be formed in a side wall of the front casing 18A if the first and second sound emitting holes 18*a* and 18*b* can be located so as to face the front outer space 6. Also in this case, the same operation and effect as in the embodiment can be obtained.

What is claimed is:

1. An electromagnetic electroacoustic transducer, comprising:

a diaphragm made of a magnetic material;

a magnet for generating a magnetostatic field to make the magnetostatic field act on the diaphragm;

an electromagnetic coil for generating an oscillating magnetic field corresponding to an electric signal to make the oscillating magnetic field act on the diaphragm;

a casing for storing the diaphragm, the magnet and the electromagnetic coil therein; and a lead terminal connected to a coil terminal of the electromagnetic coil, wherein the case has at least one first sound emitting hole through which a front space on a front surface of the diaphragm in the casing communicates with a front outer space in front of the casing and at least one second sound emitting hole through which a rear space on a rear surface of the diaphragm in the casing communicates with the front outer space in front of the casing through a space provided to a portion at which the lead terminal and the coil terminal are connected; and a resonant frequency Fv2 of the rear space is set at a value in the range:

$$F0<Fv2\leqq Fv1$$

in which F0 is a resonant frequency of the diaphragm, and Fv1 is a resonant frequency of the front space.

2. The electromagnetic electroacoustic transducer according to claim 1, wherein the resonant frequency Fv2 and the resonant frequency F0 have the relation:

$$Fv2\geqq 1.2\times xF0.$$

3. The electromagnetic electroacoustic transducer according to claim 1, wherein the resonant frequency Fv2 is set at a value near a frequency equal to an integral multiple of the resonant frequency F0.

4. An electromagnetic electroacoustic transducer comprising:

a diaphragm made of a magnetic material;

a magnet for generating a magnetostatic field to make the magnetostatic field act on the diaphragm;

an electromagnetic coil for generating an oscillating magnetic field corresponding to an electric signal to make the magnetic field corresponding to an electric signal to make the oscillating magnetic field act on the diaphragm; and a casing for storing the diaphragm, the magnet and the electromagnetic coil therein, wherein the case has at least one first sound emitting hole through which a front space on a front surface of the diaphragm in the casing communicates with a front outer space in front of the casing and at least one second sound emitting hole through which a rear space on a rear surface of the diaphragm in the casing communicates with the front outer space in front of the casing, and a resonant frequency Fv2 of the rear space is set at a value in the range:

$$F0<Fv2\leqq Fv1$$

in which F0 is a resonant frequency of the diaphragm, and Fv1 is a resonant frequency of the front space, the resonant frequency Fv1 is set at a value near a frequency three times as high as the resonant frequency F0, and the resonant frequency Fv2 is set at a value near a frequency twice as high as the resonant frequency F0.

5. The electromagnetic electroacoustic transducer according to claim 1, wherein the space provided to the portion at which the lead terminal and the coil terminal are connected is provided to a corner portion of the casing.

* * * * *

UNITED STATES PATENT AND TRADEMARK OFFICE

CERTIFICATE OF CORRECTION

PATENT NO. : 6,907,955 B2
DATED : June 21, 2005
INVENTOR(S) : Mitsuhiro Masuda

It is certified that error appears in the above-identified patent and that said Letters Patent is hereby corrected as shown below:

Column 12,
Line 1, Claim 2 should read as follows:

2. The electromagnetic electroacoustic transducer according to claim 1, wherein the resonant frequency Fv2 and the resonant frequency F0 have the relation:

$Fv2 \geqq 1.2xF0$.

Signed and Sealed this

Twenty-second Day of November, 2005

JON W. DUDAS
*Director of the United States Patent and Trademark Office*